(12) United States Patent
Biellmann et al.

(10) Patent No.: US 11,394,289 B2
(45) Date of Patent: Jul. 19, 2022

(54) METHOD FOR CONTROLLING A MODULE FOR CONTROLLING A TRANSISTOR

(71) Applicant: VITESCO TECHNOLOGIES GmbH, Hanover (DE)

(72) Inventors: Cedrick Biellmann, Toulouse (FR); Thierry Bavois, Toulouse (FR)

(73) Assignee: VITESCO TECHNOLOGIES GMBH, Hannover (DE)

( * ) Notice: Subject to any disclaimer, the term of this patent is extended or adjusted under 35 U.S.C. 154(b) by 0 days.

(21) Appl. No.: 17/257,442

(22) PCT Filed: Jul. 9, 2019

(86) PCT No.: PCT/EP2019/068395
§ 371 (c)(1),
(2) Date: Dec. 31, 2020

(87) PCT Pub. No.: WO2020/011781
PCT Pub. Date: Jan. 16, 2020

(65) Prior Publication Data
US 2021/0126521 A1   Apr. 29, 2021

(30) Foreign Application Priority Data

Jul. 10, 2018 (FR) ....................... 1856310

(51) Int. Cl.
*H02M 1/08* (2006.01)
*F02D 41/30* (2006.01)
(Continued)

(52) U.S. Cl.
CPC .............. *H02M 1/08* (2013.01); *F02D 41/20* (2013.01); *F02D 41/3005* (2013.01);
(Continued)

(58) Field of Classification Search
None
See application file for complete search history.

(56) References Cited

U.S. PATENT DOCUMENTS 7,621,259 B2 * 11/2009 Mayuzumi .............. F02D 41/20
123/490
9,590,609 B1 * 3/2017 Musa ................ H03K 17/08122
(Continued)

FOREIGN PATENT DOCUMENTS

EP      2 366 880      9/2011

OTHER PUBLICATIONS

International Search Report for PCT/EP2019/068395 dated Sep. 26, 2019, 5 pages.
(Continued)

*Primary Examiner* — Jeffery S Zweizig
(74) *Attorney, Agent, or Firm* — Nixon & Vanderhye

(57) ABSTRACT

Disclosed is a method for controlling a module for driving a transistor of a DC-DC voltage converter allowing at least one fuel injector of a motor-vehicle internal combustion engine to be controlled. The method includes a step of measuring the amplitude of the current flowing through that of the first switch or of the second switch that is in the on state, a step of determining the electric charge transported by the current, and a step of interrupting the operation of the drive module when the determined electric charge is higher than a preset maximum electric-charge threshold.

10 Claims, 1 Drawing Sheet

(51) Int. Cl.
  *F02M 51/06*  (2006.01)
  *H02M 1/32*  (2007.01)
  *H02M 3/155*  (2006.01)
  *F02D 41/20*  (2006.01)
  *H02M 1/00*  (2006.01)

(52) U.S. Cl.
  CPC .............. *F02M 51/06* (2013.01); *H02M 1/32* (2013.01); *H02M 3/155* (2013.01); *H02M 1/0009* (2021.05)

(56) References Cited

U.S. PATENT DOCUMENTS

2004/0027762 A1  2/2004  Ohi et al.
2010/0231269 A1  9/2010  Nakatake et al.

OTHER PUBLICATIONS

Written Opinion of the ISA for PCT/EP2019/068395 dated Sep. 26, 2019, 6 pages.

* cited by examiner

METHOD FOR CONTROLLING A MODULE FOR CONTROLLING A TRANSISTOR

CROSS-REFERENCE TO RELATED APPLICATIONS

This application is the U.S. national phase of International Application No. PCT/EP2019/068395 filed Jul. 9, 2019 which designated the U.S. and claims priority to FR 1856310 filed Jul. 10, 2018, the entire contents of each of which are hereby incorporated by reference.

BACKGROUND OF THE INVENTION

Field of the Invention

The present invention relates to driving a transistor and more particularly to a method for controlling a module for driving a transistor of a DC-DC voltage converter and to a motor-vehicle DC-DC voltage converter.

Description of the Related Art

In ICE motor vehicles (ICE standing for Internal Combustion Engine), it is known to use a DC-DC voltage converter to deliver the energy required to drive fuel injectors. Such a converter notably allows the voltage delivered by the battery of the vehicle, about 12 V for example, to be converted into a higher target output voltage, 65 V for example, that allows a capacitor, called the intermediate capacitor, connected to the output of the converter and that delivers current to a control module allowing, on command by a computer, the fuel injectors to be controlled, to be recharged.

Thus, when the computer commands the control module, the latter uses the current delivered by the intermediate capacitor to drive the fuel injectors. In so doing, the intermediate capacitor discharges and the converter then activates to recharge it until the output voltage returns to its target value.

The internal operating principle of the converter consists in charging a coil with the current delivered by the battery and in cutting the current cyclically, using a switch, especially an MOS transistor for example. When the switch is closed (i.e. in the on state in which current flows), the coil charges, and when the switch is open (i.e. in the off state), the energy stored in the coil is transmitted in the form of a current to the intermediate capacitor in order to recharge it. The alternation of the closed and open states of the switch thus generates a sawtooth current, called the peak current, the maximum amplitude of which is a value comprised between a set maximum threshold and a set minimum threshold.

The amplitude of this peak current allows the output voltage to rise at a greater or lesser rate. In particular, when the maximum amplitude of the peak current is high, the output voltage of the converter rises rapidly after a voltage drop and, in contrast, when the maximum amplitude of the peak current is low, the output voltage of the converter rises slowly. In both cases, the converter ceases to produce the peak current when the output voltage reaches its target value.

In order to switch the transistor, the converter comprises a drive module connected to the gate of the transistor so as to command it shut (on state in which current passes between the drain and the source) or open (off state).

In one known solution, the drive module comprises a logic control unit, a first switch, connected on the one hand to a supply and on the other hand to the gate of the transistor, and a second switch, connected on the one hand to the gate of the transistor and on the other hand to a ground (push-pull configuration). The logic control unit controls the first switch and the second switch so that the assembly formed from said first switch and from said second switch switches between two configurations.

In a first configuration, the logic control unit controls the first switch so that it is in a closed position (on state) and the second switch so that it is simultaneously in an open position (off state). This first configuration is called the "on" configuration of the drive module.

In a second configuration, the logic control unit controls the first switch so that it is in an open position and the second switch so that it is simultaneously in an off position. This second configuration is called the "off" configuration of the drive module. The logic control unit receives the commands to be applied to achieve either the first configuration or the second configuration.

A problem arises when the drive module is subjected to a short-circuit for which it remains in its on or off configuration. Specifically, the drive module is dimensioned to remain in its first configuration (on) or in its second figuration (off) only for a very limited time. There beyond, the current flowing through the drive module may damage it.

One known way of remedying these drawbacks consists in observing the current coming from the supply and in interrupting it when its amplitude exceeds a preset threshold. However, this solution does not allow damage caused to the drive module when the amplitude of the current is below the threshold but the current flows for a long time through the drive module to be avoided.

Another known solution consists in observing the internal temperature of the drive module with a sensor so as to interrupt the operation thereof when the temperature exceeds a preset threshold, 170° C. for example. However, such a temperature measurement may prove to be relatively slow, and hence the current may damage the drive module before its operation is interrupted.

Another known solution consists in comparing the voltage delivered via the output of the drive module with a reference voltage with a view to detecting a short-circuit between the drain and gate of the transistor. However, this solution is not enough to prevent damage to the drive module because it does not protect the converter when the short-circuit voltage is below the detection range given that current still flows through the switches, possibly damaging them.

SUMMARY OF THE INVENTION

There is therefore a need for a simple, rapid, reliable, inexpensive and effective way of preventing the converter from operating at its current and temperature limits, at which it could be damaged.

To this end, the invention firstly relates to a method for controlling a module for driving a transistor of a DC-DC voltage converter allowing at least one fuel injector of a motor-vehicle internal combustion engine to be controlled, said converter comprising a control module and an induction coil connected to a field-effect transistor comprising a drain, a source and a gate, said gate being connected to the control module in order for said control module to command the transistor to an on state in which current passes between the drain and the source or to an off state in which current does not pass between the drain and source, the alternation of the on and off states of the transistor generating a sawtooth current called the peak current that allows the converter to deliver an output voltage across the terminals of a capacitor called the "intermediate" capacitor, the discharge of which is commanded by a computer via a drive module in order to command at least one fuel injector, the converter furthermore comprising a drive module connected between the control module and the transistor and that is suitable for receiving a supply voltage, the drive module comprising a logic control unit, a first two-position switch, connected on the one hand to a supply and on the other hand to the gate of the transistor, and a second two-position switch, connected on the one hand to the gate of the transistor and on the other hand to ground, said first switch and said second switch being configured to each simultaneously be in a different, on or off, state, said method being characterized in that it comprises:

a step of measuring the amplitude of the current flowing through that of the first switch or of the second switch that is in the on state, a step of determining the electric charge transported by said current, and a step of interrupting the operation of the drive module when the determined electric charge is higher than a preset maximum electric-charge threshold.

By the terms "interrupting the operation of the drive module", what is meant is that the drive module is kept in a stopped configuration in which the first switch is open (off state) and the second switch is open (off state).

The method according to the invention allows the drive module to be stopped before it is damaged. In particular, the determination of the electric charge transported by the current and its comparison with a preset threshold allows the moment at which it is necessary to stop the drive module to be precisely quantified, contrary to measurements of current amplitude or of temperature which are imprecise or slow. The method according to the invention allows the variation in the current as a function of time to be monitored whereas the prior-art solutions detect only thresholds at a given time.

Preferably, the method comprises a step of restarting the drive module after a time called the "cooling" time. The cooling time corresponds to the length of time that the temperature of the drive module takes to drop below a preset temperature threshold. To this end, the drive module may for example measure its internal temperature and restart when said temperature is below the preset temperature threshold.

By "restart" what is meant is that the drive module is switched to an on configuration in which the first switch is closed (on state) and the second switch is open (off state).

Preferably, the value of the preset maximum electric-charge threshold is comprised between 100 and 200 nC, this value being configurable in order to correspond to the amount of electric charge required to charge or discharge the gate of the transistor.

Advantageously, the electric charge transported by the current is determined using an integrator circuit.

The invention also relates to a module for driving a transistor of a DC-DC voltage converter allowing at least one fuel injector of a motor-vehicle internal combustion engine to be controlled, said converter comprising a control module and an induction coil connected to a field-effect transistor comprising a drain, a source and a gate, said gate being connected to the control module in order for said control module to command the transistor to an on state in which current passes between the drain and the source or to an off state, the alternation of the on and off states of the transistor generating a sawtooth current called the peak current that allows the converter to deliver an output voltage across the terminals of a capacitor called the "intermediate" capacitor, the discharge of which is commanded by a computer via a drive module in order to command at least one fuel injector, said drive module being connected between the control module and the transistor and being suitable for receiving a supply voltage, the drive module comprising a logic control unit, a first two-position switch, connected on the one hand to a supply and on the other hand to the gate of the transistor, and a second two-position switch, connected on the one hand to the gate of the transistor and on the other hand to ground, said first switch and said second switch being configured to each simultaneously be in a different, on or off, state. The drive module is configured to:

measure the amplitude of the current flowing through that of the first switch or of the second switch that is in the on state, determine the electric charge transported by said current, and interrupt the operation of the drive module when the determined electric charge is higher than a preset maximum electric-charge threshold.

Preferably, the drive module is configured to restart after a time called the "cooling" time. The cooling time corresponds to the length of time that the temperature of the drive module takes to drop below a preset temperature threshold. To this end, the drive module may for example measure its internal temperature and restart when said temperature is below the preset temperature threshold.

Also preferably, the drive module comprises an integrator circuit allowing the electric charge transported by the current to be determined.

Advantageously, the integrator circuit comprises a current-measuring unit configured to measure the current flowing through that of the first switch or of the second switch that is in the on state, a capacitor and an operational amplifier comprising a first input, a second input and an output, the first input being connected to the current-measuring unit, the second input being connected to a terminal of the capacitor and the output of the operational amplifier being connected to the other terminal of the capacitor.

Also advantageously, the integrator circuit comprises a resistance connected in parallel with a capacitor.

According to one aspect of the invention, the drive module furthermore comprises a comparator connected between the output of the integrator circuit and the logic control unit.

Preferably, the value of the maximum threshold of this comparator and the preset electric-charge threshold is comprised between 100 and 200 nC. This value of the maximum threshold is configurable depending on the charge required to switch the transistor to the on state and to the off state.

Lastly, the invention relates to a motor vehicle comprising a converter such as presented above.

BRIEF DESCRIPTION OF THE DRAWINGS

Other features and advantages of the invention will become apparent from the following description, given with reference to the appended figures that are given by way of non-limiting examples and in which identical references are given to similar objects.

DESCRIPTION OF THE PREFERRED EMBODIMENTS

Figure 1:
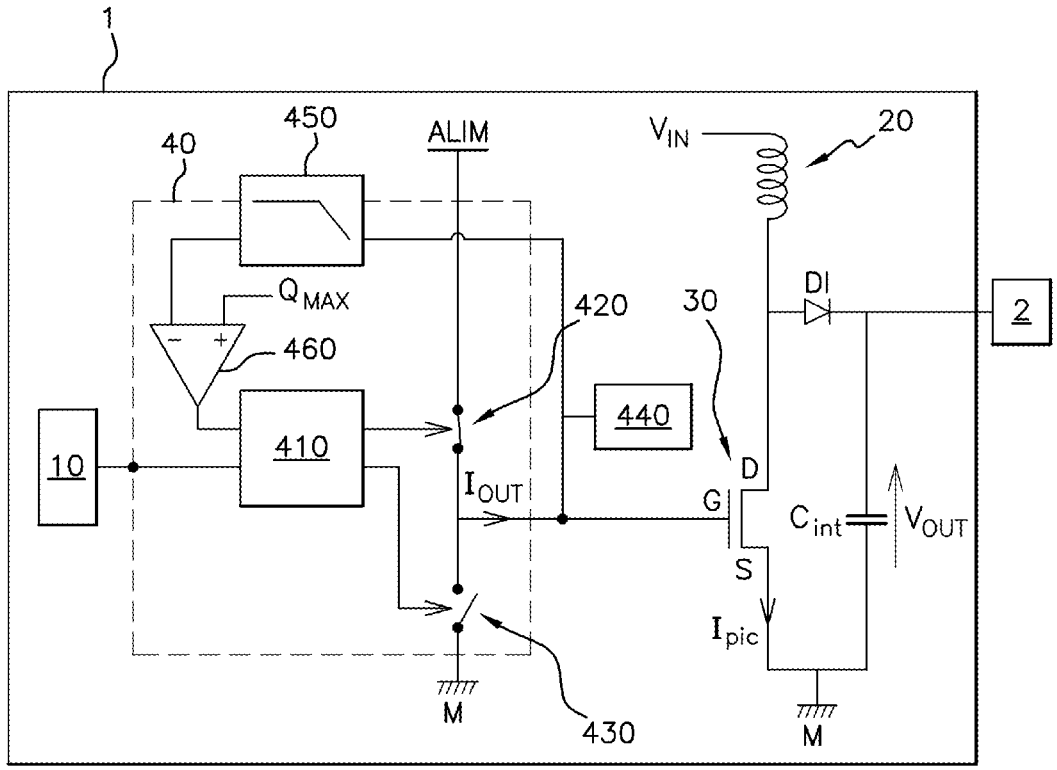
FIG. 1 illustrates one embodiment of the converter according to the invention.

FIG. 1 shows one example of a converter 1 according to the invention. The converter 1 is intended to be installed in a motor vehicle, for example in order to deliver an output voltage Vout allowing fuel injectors 2 to be controlled. The converter 1 is a DC-DC voltage converter. In the example described below, but non-limitingly, the converter 1 is a boost converter 1 allowing a capacitor called an "intermediate" capacitor Cint, which supplies the current required to activate the fuel injectors 2, to be recharged.

To this end, the converter 1 converts an input voltage $V_{IN}$ into an output voltage Vout applied across the terminals of the intermediate capacitor Cint, these voltages being measured with respect to ground M.

The converter 1 comprises a control module 10, an induction coil 20, and a field-effect transistor 30. The induction coil 20 is installed at the input of the circuit so as to be charged when it is passed through by a current produced by the input voltage $V_{IN}$.

A diode DI is installed between the induction coil 20 and the high terminal of the intermediate capacitor Cint, which terminal corresponds to the output of the converter 1, i.e. the terminal connected to the injectors 2. The diode DI lets current pass from the induction coil 20 to the intermediate capacitor Cint but prevents current from flowing from the intermediate capacitor Cint to the induction coil 20 in order to prevent the intermediate capacitor Cint from discharging into the converter 1.

The transistor 30 comprises a drain D, a source S and a gate G, said gate G being controlled by the control module 10 via a drive module 40 in order for said drive module 10 to command the transistor 30 to an on state in which current passes between the drain D and the source S or to an off state in which current does not pass between the drain D and the source S. The source is connected to ground M.

The alternation of the on and off states of the transistor 30 generates, between the source S of the transistor 30 and ground M, a sawtooth current, called the peak current Ipic, that allows the converter 1 to deliver an output voltage Vout across the terminals of a capacitor, called the "intermediate" capacitor, with a view to powering at least one fuel injector 2. The amplitude of the peaks of the peak current Ipic varies between 0 and a maximum value at a given time. This maximum value is limited by a ceiling that defines the power limit of the converter 1.

The converter 1 furthermore comprises a drive module 40 allowing the transistor 30 to be driven. The drive module 40 is connected between the control module 10 and the transistor 30 and is connected to the supply ALIM. More precisely, the drive module 40 is connected to the gate G of the transistor 30 so as to command said transistor 30 closed (on state) or open (off state). The supply ALIM is delivered by the supply Vin via a regulator (not shown in FIG. 1).

The drive module 40 comprises a logic control unit 410, a first switch 420, connected on the one hand to the supply ALIM and on the other hand to the gate G of the transistor 30, and a second switch 430, connected on the one hand to the gate G of the transistor 30 and on the other hand to ground M. The first switch 420 and the second switch 430 are two-position switches able to be either in a position called the "closed" position, in which they conduct current (state in which current is passed), or to a position called the "open" position, in which they prevent current from flowing.

The logic control unit 410 controls the first switch 420 and the second switch 430 so that the assembly formed from said first switch 420 and from said second switch 430 switches between two configurations.

In a first configuration, the logic control unit 410 controls the first switch 420 so that it is in its closed position (state in which current passes) and the second switch 430 so that it is simultaneously in its open position (off state). This configuration is called the "on" configuration of the drive module 40.

In a second configuration, the logic control unit 410 controls the first switch 420 so that it is in its open position and the second switch 430 so that it is simultaneously in its closed position. This configuration is called the "off" configuration of the drive module 40.

The logic control unit 410 receives the commands to be applied to achieve either the first configuration or the second configuration of the drive module 40.

The drive module 40 is configured to measure the amplitude of the current Tout flowing through that of the first switch 420 or of the second switch 430 that is closed, i.e. is in the state in which current passes (depending on whether the drive module 40 is in its first or in its second configuration) using a current-measuring unit 440. In the example of FIG. 1, in which example the drive module 40 is in its first configuration, the current Tout passing through the first switch 420 is routed to the gate G of the transistor 30.

The current-measuring unit 440 may comprise a plurality of current-measuring sensors mounted in series with the first switch 420 and the second switch 430, or a single current sensor placed at the output of the drive module 40, i.e. between the first switch 420, the second switch 430 and the gate G of the transistor 30 (as illustrated in FIG. 1).

The drive module 40 is configured to determine the electric charge Q transported by said current Tout and to interrupt the operation of the drive module 40 when the computed electric charge Q is higher than a preset maximum electric-charge threshold Qmax.

To this end, the drive module 40 comprises an integrator circuit 450, which allows the current to be converted into electric charge Q transported by the current, and a comparator 460.

In the illustrated embodiment, the integrator circuit 450 comprises an amplifier and an RC circuit.

A first input of the comparator 460 is connected to the output of the integrator circuit 450 and a second input of the comparator 460 is connected to a voltage reference corresponding to the preset maximum threshold Qmax required to charge or discharge the transistor 30.

The output of the comparator 460 is connected to the logic control unit 410 in order to inform it in case of exceedance or not of the amount of current transmitted by the drive module 40.

Figure 2:
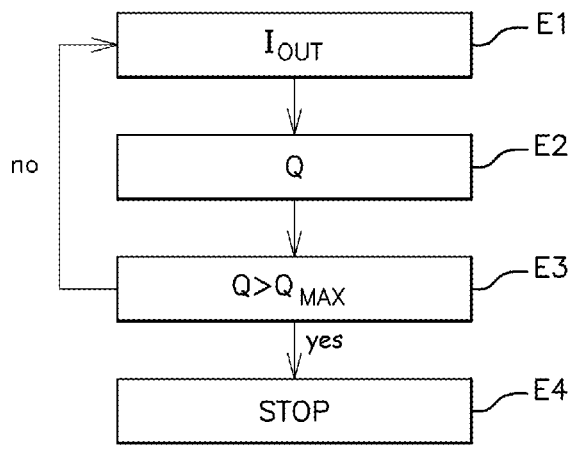
FIG. 2 illustrates one embodiment of the method according to the invention.

An example of implementation will now be described with reference to FIG. 2.

Firstly, in a step E1, the amplitude of the current Tout flowing through that of the first switch 420 or of the second switch 430 that is closed, i.e. in the on state (depending on the current configuration of the drive module 40) is measured by the current-measuring unit 440 and transmitted to the integrator circuit 450.

The integrator circuit 450 converts the received value of the current Tout into a value of the electric charge Q, in a step E2, then delivers this value of the electric charge Q to the comparator 460.

When the comparator 460 detects, in a step E3, that the determined value of the electric charge Q has risen above a preset maximum electric-charge threshold Qmax, the comparator 460 transmits this information to the logic control unit 410 which then interrupts the operation of the drive module 40 in a step E4. These steps are performed each time the drive module 40 is turned on or off.

The method according to the invention allows the operation of the drive module to be stopped before it reaches its operating limits in terms of current and temperature, thus avoiding damage thereto.

The invention claimed is:

1. A method for controlling a drive module configured to drive a field-effect transistor of a DC-DC voltage converter allowing at least one fuel injector of a motor-vehicle internal combustion engine to be controlled, said converter including a control module and an induction coil connected to the field-effect transistor including a drain, a source, and a gate, said gate being connected to the control module in order for said control module to command the field-effect transistor to an on state in which current passes between the drain and the source or to an off state, alternating the on and off states of the field-effect transistor generating a peak sawtooth current that allows the converter to deliver an output voltage across terminals of an intermediate capacitor, a discharge of which is commanded by a computer via the drive module in order to command the at least one fuel injector, the converter including the drive module connected between the control module and the field-effect transistor, the drive module being configured to receive a supply voltage, said drive module including a logic controller, a first two-position switch connected to a supply providing the supply voltage and the gate of the field-effect transistor, and a second two-position switch connected to the gate of the field-effect transistor and ground, said first two-position switch and said second two-position switch being configured to each simultaneously be in a different on or off state, said method comprising:
measuring an amplitude of the current flowing through the first two-position switch or the second two-position switch that is in the on state;
determining an electric charge transported by said current; and
interrupting the operation of the drive module when the determined electric charge is higher than a preset maximum electric-charge threshold.

2. The method as claimed in claim 1, wherein the value of the preset maximum electric-charge threshold is between 100 and 200 nC.

3. The method as claimed in claim 1, wherein the electric charge transported by the current is determined using an integrator circuit.

4. The method as claimed in claim 2, wherein the electric charge transported by the current is determined using an integrator circuit.

5. A module configured to drive a field-effect transistor of a DC-DC voltage converter allowing at least one fuel injector of a motor-vehicle internal combustion engine to be controlled, said converter including a control module and an induction coil connected to the field-effect transistor including a drain, a source, and a gate, said gate being connected to the control module in order for said control module to command the field-effect transistor to an on state in which conduction occurs between the drain and the source or to an off state in which conduction does not occur between the drain and the source alternating the on and off states of the field-effect transistor generating a peak sawtooth current called the peak current that allows the converter to deliver an output voltage across terminals of an intermediate capacitor, a discharge of which is commanded by a computer via the drive module in order to command the at least one fuel injector, said drive module being connected between the control module and the field-effect transistor, the drive module being configured to receive a supply voltage, the drive module including a logic controller, a first two-position switch connected to a supply providing the supply voltage and the gate of the field-effect transistor, and a second two-position switch connected to the gate of the field-effect transistor and also to ground said first two-position switch and said second two-position switch being configured to each simultaneously be in a different on or off state, the drive module being configured to:
measure an amplitude of the current flowing through the first two-position switch or the second two-position switch that is in the on state,
determine an electric charge transported by said current, and
interrupt the operation of the drive module when the determined electric charge is higher than a preset maximum electric-charge threshold.

6. The drive module as claimed in claim 5, further comprising an integrator circuit allowing the electric charge transported by the current to be determined.

7. The drive module as claimed in claim 6, further comprising a comparator connected between an output of the integrator circuit and the logic controller.

8. The drive module as claimed in claim 7, wherein a value of a maximum threshold of the comparator and the preset maximum electric-charge threshold is between 100 and 200 nC.

9. A motor vehicle comprising:
the converter as claimed in claim 5.

10. A motor vehicle comprising:
the converter as claimed in claim 6.

* * * * *